(12) United States Patent
Barrett et al.

(10) Patent No.: US 6,310,298 B1
(45) Date of Patent: *Oct. 30, 2001

(54) PRINTED CIRCUIT BOARD SUBSTRATE HAVING SOLDER MASK-FREE EDGES

(75) Inventors: Joseph C. Barrett, El Dorado; Mark P. Jamieson, Folsom, both of CA (US)

(73) Assignee: Intel Corporation, Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/001,024

(22) Filed: Dec. 30, 1997

(51) Int. Cl.$^7$ ....................................... H05K 1/03
(52) U.S. Cl. .................. 174/250; 174/255; 174/260; 174/263; 361/750; 361/751
(58) Field of Search ................... 174/250, 260, 174/256, 258, 255, 263; 257/787; 361/748, 750, 751; 438/113, 124, 126, 462

(56) References Cited

U.S. PATENT DOCUMENTS

| | | | | |
|---|---|---|---|---|
| 5,157,001 | * | 10/1992 | Sakuma | 438/462 X |
| 5,336,931 | * | 8/1994 | Juskey et al. | 257/787 |
| 5,652,185 | * | 7/1997 | Lee | 438/113 |
| 5,773,764 | * | 6/1998 | Von Vajna | 174/250 |

* cited by examiner

*Primary Examiner*—Albert W. Paladini
(74) *Attorney, Agent, or Firm*—Blakely, Sokoloff, Taylor & Zafman LLP

(57) ABSTRACT

A substrate for a plurality of electronic assemblies includes a strip of printed circuit board (PCB) material including a surface and a plurality of segments. Each segment is adapted to receive at least one electronic component and is arranged to be singulated into a plurality of individual electronic assemblies. Each segment has a perimeter portion located generally about the periphery of the segment, with the surface being covered with a solder mask, except for the perimeter portion.

8 Claims, 2 Drawing Sheets

PRINTED CIRCUIT BOARD SUBSTRATE HAVING SOLDER MASK-FREE EDGES

BACKGROUND OF THE INVENTION

1. Field of the Invention

The invention relates generally to electronic component packages, and more specifically, to a semiconductor package that is enhanced to reduce solder mask cracks and flakes.

2. Description of Related Art

Electronic assemblies having components coupled to a printed circuit board (PCB) substrate, including plastic ball grid array (PBGA) devices, plastic pin grid array (PPGA) devices, etc., are well known in the art. The PCB substrates are processed as strips that are arranged to be separated, or singulated, into individual parts upon the completion of the assembly process.

FIG. 1 illustrates a prior art strip of PCB material 10. The prior art strip of PCB material 10 includes a plurality of segments 12, the boundaries of which are indicated by broken lines in FIG. 1. Each segment is adapted to receive one or more electronic components, such as a semiconductor die. When the assembly of the part is complete, the segments 12 are singulated into individual parts. Thus, during the singulation process, a singulation blade of a shear punch or router, for example, excises the individual segments 12 from the strip of PCB substrate into separate parts.

During the assembly of parts such as these, solder mask is typically applied over the entire surface of the substrate during the substrate manufacturing process. The solder mask functions to prevent solder from flowing to areas where solder is not desired. Moreover, solder mask provides a good adhesion surface to which a component, such as a semiconductor die, may be attached. Because the solder mask material is brittle, the singulation process may introduce cracks into the solder mask. Further, the singulation process often causes pieces of solder mask to flake off the singulation parts. FIG. 2 shows a prior art singulated assembly 14, illustrating an example of a crack 16 in the solder mask, and a solder mask flake 18 that has chipped off of the assembly 14 from a location 20.

The cracks 16 and flakes 18 cause several problems. For example, the crack 16 may result in a stress concentration, causing the crack 16 to propagate into the PCB material below, or into a conductive trace therein. This could bring about a functional failure of the assembly. Solder mask flakes 18 may cause problems in subsequent manufacturing operations. In particular, the solder mask flakes 18 may contaminate sockets of test equipment, requiring increased cleaning of the sockets to maintain production. Further, the solder mask flakes 18 may migrate to other areas of the package assembly facility, such as the area in which the semiconductor die is attached to the substrate, resulting in the die not being properly attached.

The present invention addresses some of the above mentioned and other problems of the prior art.

SUMMARY OF THE INVENTION

In one aspect of the invention, a substrate for a plurality of electronic assemblies, includes a strip of printed circuit board (PCB) material that includes a surface. The strip of PCB material includes a plurality of segments, with each segment adapted to receive at least one electronic component. The strip of PCB material is further arranged to be singulated into a plurality of individual electronic assemblies. Each segment has a perimeter portion located generally about the periphery of the segment, wherein the surface is covered with a solder mask, except for the perimeter portions.

In another aspect of the invention, a method of singulating a strip of PCB material into a plurality of individual substrate segments includes defining a plurality of perimeter portions about the periphery of each segment on a surface of the PCB material, and coating the surface with a solder mask, except for the perimeter portions. The substrate segments are singulated at the perimeter portions.

BRIEF DESCRIPTION OF THE DRAWINGS

Other objects and advantages of the invention will become apparent upon reading the following detailed description and upon reference to the drawings in which.

Figure 1:
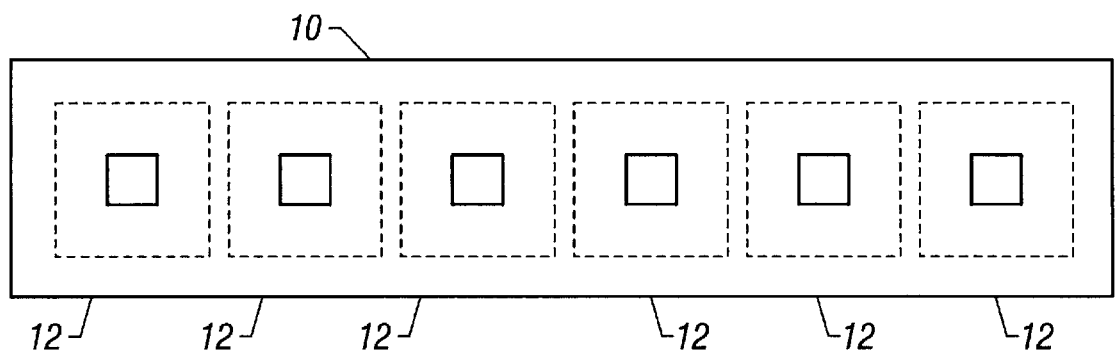
FIG. 1 is a plan view of a prior art strip of printed circuit board material.
Figure 2:
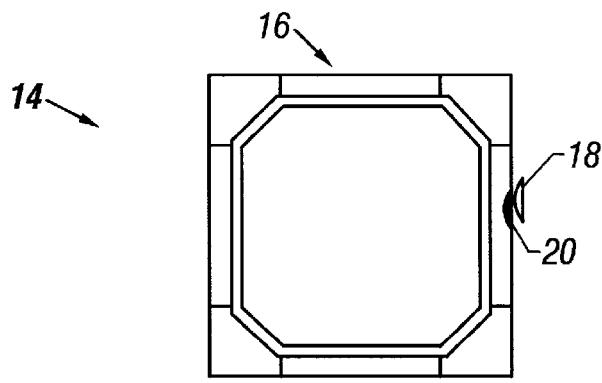
FIG. 2 is a plan view of a prior art semiconductor package.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Figure 3:
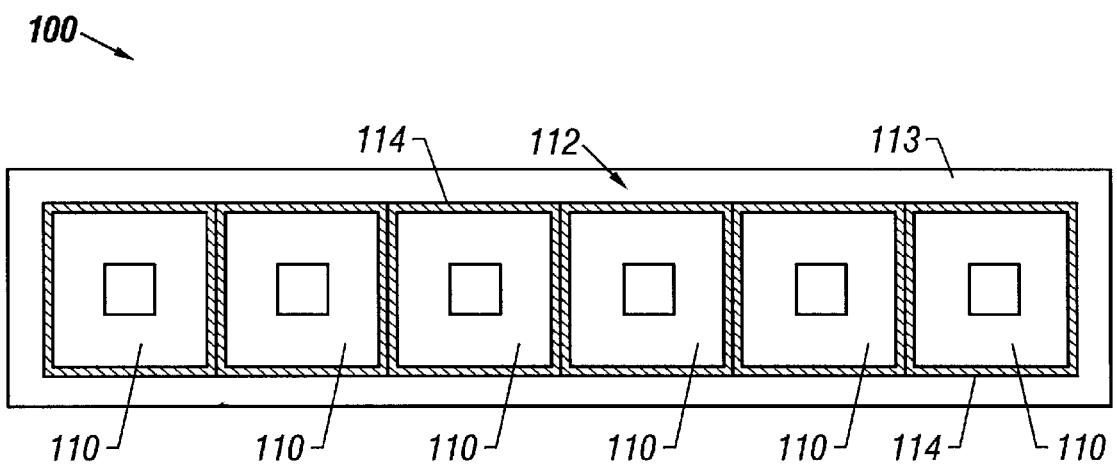
FIG. 3 is a plan view of a strip of printed circuit board material in accordance with an embodiment of the present invention.

FIG. 3 illustrates a strip of printed circuit board (PCB) material 100 in accordance with an embodiment of the present invention. The strip of PCB material 100 serves as the substrate for an electronic assembly, such as a plastic ball grid array (PBGA) device, though the present invention is not limited to PBGA devices. The present invention may also be applied, for example, to a pin grid array (PGA) device, or any other device wherein PCB material is singulated into individual substrates. For purposes of illustration, the present invention will be disclosed in terms of an exemplary PBGA device.

The strip of PCB material 100 may comprise a laminate including Bismaleimide Triazine (BT), standard Fire Retardant-4 (FR-4) PCB material, or other suitable PCB material. BT is often preferred over FR-4 due to its higher glass transition temperature. The strip of PCB material 100 includes a plurality of segments 110, each of which is adapted to receive one or more electronic components, such as a semiconductor die. A plurality of conductive traces (not shown) are arranged to couple the component(s) coupled to the segments 110 to various conductive pads (not shown) on the underside of the strip of PCB material. In a PBGA device, solder balls are coupled to the conductive pads.

The segments are arranged such that, when the assembly process is completed, the segments are excised, or singulated, into individual PBGA devices. The singulation process may comprise a shear punch or routing operation, for example, in which a singulation blade cuts the individual parts out of the strip of PCB material 100.

As discussed in the Background of the Invention section herein, a top surface 112 of the strip of PCB material 100 is generally coated with a solder mask 113, such as a dry or multiple-pass wet film solder mask. A bottom surface (not shown) may be similarly covered with the solder mask 113. However, the singulation process often introduces cracks in the solder mask and causes pieces of solder mask to flake off of the singulated parts. I n the illustrated embodiment of the present invention, a perimeter portion 114, located generally about the periphery of each of the segments 110, is defined that is void of solder mask. The perimeter portion 114 is arranged such that a singulation blade does not contact the solder mask 113 when the segments 110 are singulated into individual parts. In one embodiment of the invention, the solder mask 113 is applied to the entire surface 112, then the solder mask 113 is removed from the perimeter portion 114.

In embodiments where the bottom surface is also covered with the solder mask 113, the bottom surface also includes the perimeter portion 114 that is void of the solder mask 113. This ensures that a singulation blade does not contact the solder mask 113 during the singluation process.

Figure 4:
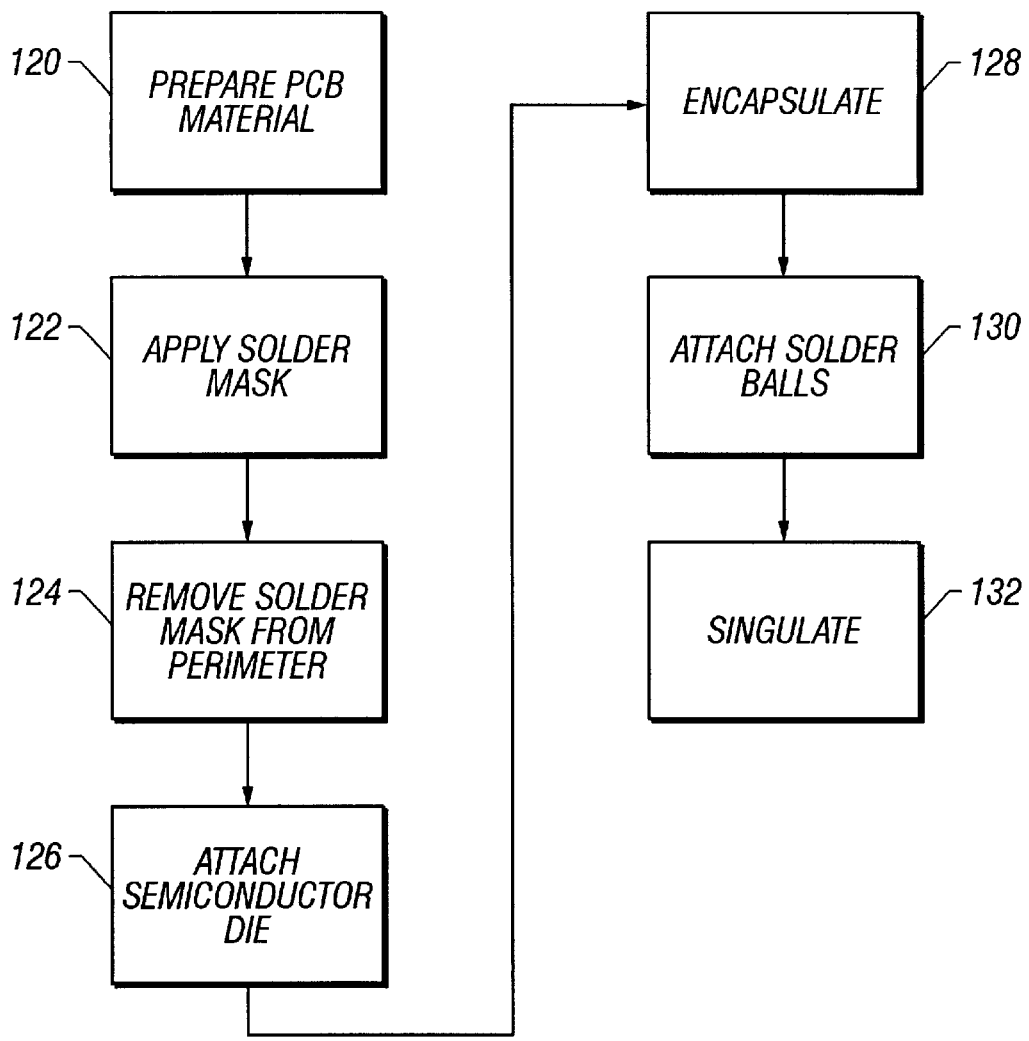
FIG. 4 is a flow diagram illustrating a method of assembling a plastic ball grid array device in accordance with an embodiment of the present invention.

FIG. 4 is a flow diagram illustrating a method for assembling a PBGA device in accordance with an embodiment of the present invention. The method illustrated in FIG. 4 is exemplary, in that, as discussed above, the present invention is not limited to PBGA devices. Rather, one skilled in the art having the benefit of this disclosure may apply the present invention to any assembly process wherein a solder mask is applied to a strip of substrate material that is to be singulated into individual parts.

In block 120 of FIG. 4, the PCB material is prepared as is known in the art, including, for example, preparing the PCB material to receive the semiconductor dice, defining trace patterns, arranging and plating traces, drilling and plating vias, etc. The solder mask is applied to a surface of the PCB material in block 122, and the solder mask is removed from the perimeter portion in block 124. Alternatively, the solder mask may be applied in block 122 such that the perimeter portion does not receive solder mask, eliminating the need for block 124.

In block 126, the semiconductor dice are applied to each segment by any appropriate method, such as wire bond, tape automated bonding (TAB), C4, etc. The semiconductor die, wires, wire bond pads, etc., are then encapsulated with an overmold, a liquid encapsulation, or other suitable encapsulation in block 128. In block 130, solder balls are attached to the underside of the PCB material. The method of FIG. 4 may be modified by one skilled in the art as appropriate for the specific type of device being manufactured. For example, in a PGA device, block 130 of FIG. 4 would be replaced by an operation for coupling pins to the PCB substrate.

In block 132, the segments a re singulated into individual PBGA devices. The singulation process of block 132 may comprise a shear punch operation, a routing operation, or other suitable singulation means. The perimeter portion, from which the solder mask was re moved in block 124, is arranged so that a singulation blade used in the singulation process of block 132 does not contact the solder mask when the segments are singulated. Defining the specific perimeter portion from which solder mask is removed so that a singulation blade does not contact solder mask would be a routine undertaking for one skilled in the art having the benefit of this disclosure.

Figure 5:
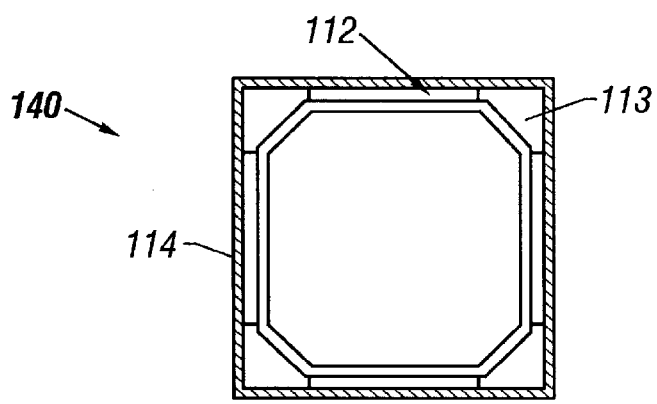
FIG. 5 is a plan view of a semiconductor package in accordance with an embodiment of the present invention.

FIG. 5 illustrates an individual part 140 that has been singulated from the strip of PCB material 100. The individual part 140 includes the perimeter portion 114 that is solder mask-free. Since the singulation blade did not contact solder mask during the singulation process, the likelihood of solder mask flakes contaminating test sockets or other equipment used in manufacturing processes subsequent to singulation is greatly reduced. The inclusion of the solder mask-free perimeter portion 114 and thereby preventing the singulation blade from contacting the solder mask, also greatly reduces the number of solder mask cracks. This, in turn, reduces conductive trace failures due to solder mask defects.

Thus, the solder mask extends 113 over most of the surface 112 so as to provide necessary protection for the part and a good surface for attaching the electronic components. However, the solder mask 113 does not extend to the edge s 114 of the singulated part 140, thereby protecting the perimeter portion 114 from cracking and flaking during the singulation process.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A substrate for a plurality of electronic assemblies, comprising:
    a strip of printed circuit board (PCB) material;
    a first surface of said strip of PCB material, said first surface covered with a solder mask;
    a plurality of segments of said strip of PCB material, each segment to receive at least one electronic assembly following a singulation of said segment at a perimeter portion of said segment, said perimeter portion devoid of solder mask at said first surface prior to said singulation, without cutting into said PCB material.

2. The substrate of claim 1 further comprising a second surface, said second surface covered with solder mask, except at said perimeter portion.

3. The substrate of claim 1 where each said segment is adapted to receive at least one electronic assembly which includes at least one plastic ball grid array device following a singulation of said segment.

4. The substrate of claim 1 wherein the strip of PCB material is arranged to undergo said singulation by a singulation blade.

5. The substrate of claim 4 wherein the perimeter portion is arranged such that the singulating blade does not contact the solder mask.

6. The substrate of claim 1 wherein the PCB material comprises a Bismaleimide Triazine laminate.

7. The substrate of claim 1 wherein the PCB material comprises a fire retardant laminate.

8. A substrate for a plurality of electronic assemblies, said substrate comprising:
- a strip of printed circuit board (PCB) material;
- a surface of said strip of PCB material, said surface having a solder mask;
- a perimeter portion of said PCB material; and
- a plurality of segments of said strip of PCB material, each segment adapted to receive at least one electronic component and comprising at least one electronic assembly following a singulation of said segment wherein said singulation includes avoidance of said solder mask without said avoidance cutting into said perimeter portion.

* * * * *